US009740814B1

(12) United States Patent
Ghosh

(10) Patent No.: US 9,740,814 B1
(45) Date of Patent: Aug. 22, 2017

(54) METHOD AND SYSTEM FOR TRIPLE PATTERNING TECHNOLOGY (TPT) VIOLATION DETECTION AND VISUALIZATION

(71) Applicant: Cadence Design Systems, Inc., San Jose, CA (US)

(72) Inventor: Sanjib Ghosh, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/750,976

(22) Filed: Jun. 25, 2015

Related U.S. Application Data

(63) Continuation-in-part of application No. 14/704,793, filed on May 5, 2015, now abandoned, which is a continuation of application No. 13/794,221, filed on Mar. 11, 2013, now Pat. No. 9,026,958.

(51) Int. Cl.
*G06F 17/50* (2006.01)

(52) U.S. Cl.
CPC ................ *G06F 17/5081* (2013.01)

(58) Field of Classification Search
USPC ............ 716/50, 51, 52, 54, 55, 139
See application file for complete search history.

(56) References Cited

U.S. PATENT DOCUMENTS

| | | | | |
|---|---|---|---|---|
| 5,538,815 A * | 7/1996 | Oi | ............... | G03F 1/28 430/30 |
| 7,761,821 B2 * | 7/2010 | Allen | ............ | G06F 17/5077 716/122 |
| 8,448,100 B1 * | 5/2013 | Lin | ............... | G03F 1/70 716/50 |
| 8,484,607 B1 * | 7/2013 | Tang | ............ | G06F 17/5081 716/136 |
| 8,516,402 B1 * | 8/2013 | Wang | ............ | G03F 1/70 716/52 |
| 8,661,371 B1 * | 2/2014 | Wang | ............ | G06F 17/5068 716/52 |
| 8,719,737 B1 * | 5/2014 | Wang | ............ | G06F 17/5081 716/50 |
| 8,775,983 B1 * | 7/2014 | Wang | ............ | G03F 7/70433 716/52 |
| 2004/0068712 A1 * | 4/2004 | Heng | ............ | G06F 17/5068 716/52 |

(Continued)

*Primary Examiner* — Brian Ngo
(74) *Attorney, Agent, or Firm* — Vista IP Law Group, LLP

(57) ABSTRACT

A method, system, and computer program product for triple patterning technology (TPT) violation detection and visualization within an integrated circuit design layout are disclosed. In a first aspect, the method comprises mapping a plurality of violations of the integrated circuit design layout to a graph, generating a color graph corresponding to the graph, detecting at least one TPT violation from the color graph; and visualizing the at least one TPT violation on a layout canvas. In a second aspect, the system comprises a graph generator module for mapping a plurality of violations of the integrated circuit design layout to a graph and to generate a color graph corresponding to the graph, a detector module for detecting at least one TPT violation from the color graph, and a visualizer module for visualizing the at least one TPT violation on a layout canvas.

20 Claims, 11 Drawing Sheets

(56) References Cited

U.S. PATENT DOCUMENTS

| | | | |
|---|---|---|---|
| 2008/0037861 A1* | 2/2008 | Nikolsky | G03F 7/70283 382/149 |
| 2010/0037200 A1* | 2/2010 | Ghan | G03F 7/70466 716/55 |
| 2011/0078638 A1* | 3/2011 | Kahng | G03F 1/144 716/52 |
| 2013/0036397 A1* | 2/2013 | Lee | G06F 17/5081 716/122 |
| 2013/0074018 A1* | 3/2013 | Hsu | G03F 1/70 716/55 |
| 2013/0080980 A1* | 3/2013 | Wang | G06F 17/5081 716/52 |
| 2013/0091476 A1* | 4/2013 | Chen | G06F 17/5077 716/55 |
| 2013/0159955 A1* | 6/2013 | Ghaida | G06F 17/5081 716/119 |
| 2013/0179848 A1* | 7/2013 | Liu | G06F 17/5072 716/55 |
| 2013/0179855 A1* | 7/2013 | Elliott | G06F 17/5009 716/139 |
| 2014/0007026 A1* | 1/2014 | Chen | G06F 17/5072 716/55 |

* cited by examiner

202

204

200

900

METHOD AND SYSTEM FOR TRIPLE PATTERNING TECHNOLOGY (TPT) VIOLATION DETECTION AND VISUALIZATION

CROSS-REFERENCE TO RELATED APPLICATION

The present application is a Continuation-In-Part Application of U.S. patent application Ser. No. 14/704,793, filed on May 5, 2015, entitled "METHOD AND SYSTEM FOR DOUBLE PATTERNING TECHNOLOGY (DPT) ODD LOOP VISUALIZATION FOR AN INTEGRATED CIRCUIT LAYOUT," which is a Continuation Application and claims priority to U.S. application Ser. No. 13/794,221, filed Mar. 11, 2013, entitled "METHOD AND SYSTEM FOR DOUBLE PATTERNING TECHNOLOGY (DPT) ODD LOOP VISUALIZATION FOR AN INTEGRATED CIRCUIT LAYOUT," all of which are incorporated herein by reference in their entireties.

FIELD OF THE INVENTION

The present invention relates generally to integrated circuit design and more specifically to a method and system for triple patterning technology (TPT) violation detection and visualization.

BACKGROUND

The physical layout of a deep submicron VLSI design has to adhere to certain design rules (or design constraints) dictated mostly by the technology used to fabricate the design. It is the task of a design rule checker (DRC) tool/module to ensure that a given layout confirms to an applicable set of design rules. The rules, provided by the manufacturer and specific to a process node, are required to ensure manufacturability and yield. If the layout does not adhere to one or more of these rules, then the DRC tool informs the designer about the design rule violations. The designer must fix each of the design rule violations before the design is considered design rule clean.

The use of double patterning technology (DPT) or dual masking adds to the complexity of the manufacturing. The manufacturing problem in dual masking systems requires DRC tools to be able to detect "odd loops" formed by shapes violating certain rules in the design. However, current designs are utilizing triple masking and conventional DRC tools cannot detect triple pattern technology (TPT) spacing violations which are different from DPT odd loop violations.

Therefore, there is a strong need for a solution that overcomes the aforementioned issues. The present invention addresses such a need.

SUMMARY OF THE INVENTION

A method, system, and computer program product for triple patterning technology (TPT) violation detection and visualization within an integrated circuit design layout are disclosed. In a first aspect, the method comprises mapping a plurality of violations of the integrated circuit design layout to a graph, generating a color graph corresponding to the graph, detecting at least one TPT violation from the color graph; and visualizing the at least one TPT violation on a layout canvas.

In a second aspect, the system comprises a graph generator module for mapping a plurality of violations of the integrated circuit design layout to a graph and to generate a color graph corresponding to the graph, a detector module for detecting at least one TPT violation from the color graph, and a visualizer module for visualizing the at least one TPT violation on a layout canvas.

In a third aspect, the computer program product contains program instructions stored in a non-transitory computer readable storage medium for providing triple patterning technology (TPT) violation detection and visualization within an integrated circuit design layout, and the program instructions are executed by a computer that performs the following steps comprising: mapping a plurality of violations of the integrated circuit design layout to a graph, generating a color graph corresponding to the graph, detecting at least one TPT violation from the color graph, and visualizing the at least one TPT violation on a layout canvas.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

Figure 1:
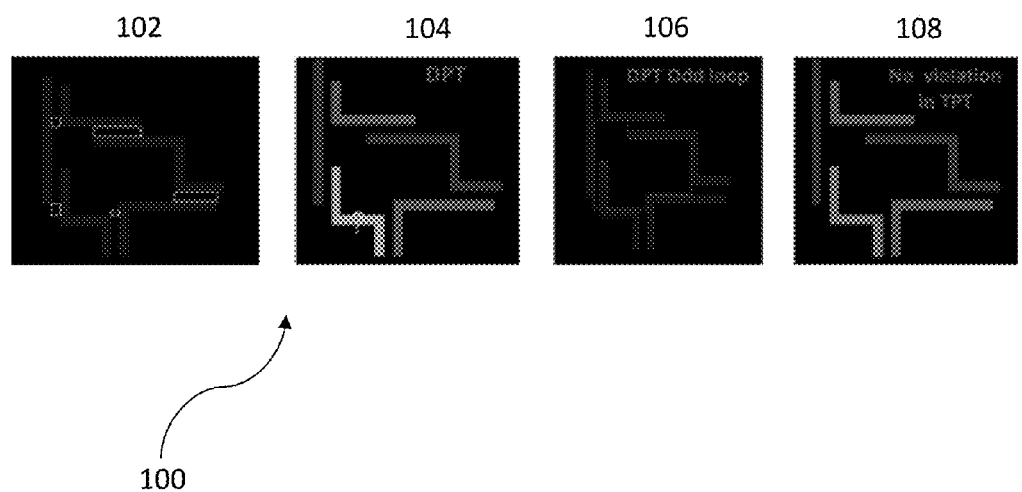
FIG. 1 illustrates a diagram that compares DPT and TPT violation detection in an integrated circuit design layout in accordance with an embodiment.

The present invention relates generally to integrated circuit design and more specifically to a method and system for triple patterning technology (TPT) violation detection and visualization. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

As aforementioned, the physical layout of a deep submicron VLSI design has to adhere to certain design rules (or design constraints) dictated mostly by the technology used to fabricate the design. It is the task of a design rule checker (DRC) tool/module (e.g., Design Rule Driven editing or DRD tools) to ensure that a given layout confirms to an applicable set of design rules. The rules, provided by the manufacturer and specific to a process node, are required to ensure manufacturability and yield. If the layout does not adhere to one or more of these rules, then the DRC tool informs the designer about the design rule violations. The designer must fix each of the design rule violations before the design is considered design rule clean.

In older process nodes (180 nm and above), DRC tools inform the engineer/designer about two things: a) which design rule was violated and b) which area of the integrated circuit (IC) layout that the violation occurred in. In most cases, this information is sufficient for the designer to understand the underlying reason for a violation and make the necessary fixes.

Current manufacturing technology results in design rules that are very complex in lower geometric nodes and different sets. Double patterning technology (DPT) is a technology that is adopted for the lower technology node to avoid geometric distortions due to lithographic problems. In 20 nm technology and below, it is not feasible to manufacture ICs with conventional lithographic technology due to the optical resolution limits. In DPT, alternate masks are used for the printing of the images instead of a single mask used in conventional lithographic technology.

Design shapes are separated by a layer minimum spacing but at a 20 nm process node and below, the design shapes cannot be printed using a single mask and so two types of masks are used by the DPT. Alternate masks are spaced by the layer minimum spacing whereas the same masks are spaced by more than double spacing of the layer minimum spacing value. DPT or dual masking systems require DRC tools to be able to detect "odd loops" formed by shapes violating certain rules in the design.

In conventional technology (single mask based), two shapes need to be a certain distance apart (e.g., as specified by the DRM rule that specifies minSpacing for that layer) or it is not possible to manufacture them. However, in dual masking technology, the two shapes are provided on separate masks (typically specified by different colors or patterns). The distance required between the two masks (diffMaskSpacing) is less than a single mask minSpacing distance (sameMaskSpacing).

Thus, DPT has various implications on design rules which results in some rules not changing much such as minSpacing (which specifies a requirement of spacing between two shapes on the same layer) while other rules require updates. For example, with DPT, the ability to specify that if two shapes are on the same mask (share the same color/pattern) then they need to be spaced at a larger distance from each other which in effect creates the "sameMask" qualifier for minSpacing.

When two shapes are on the same mask and are closer than the distance specified in sameMaskSpacing, one of the shapes (or components of the shape) is moved to the another mask. In cases where shapes are not split, colors or patterns are assigned to the shapes that are involved in a sameMaskSpacing violation. If two shapes are involved in a sameMaskSpacing violation, they are assigned different colors or patterns. This approach is complex because the same shapes can be involved in multiple sameMaskSpacing violations.

For example, when 5 shapes are involved and there are 5 pairwise sameMaskSpacing violations between them, we can assign colors in a clockwise direction across the layout starting with the color blue "B" and then red "R", blue again "B", red again "R" (B, R, B, R, X where X is the color to be assigned to the fifth shape) but we cannot assign a blue or red color to the fifth shape because if we assign blue it will conflict with the color assigned to the first shape and if we assign red it will conflict with the color assigned to the fourth shape.

In this example, the sameMaskSpacing forms an odd loop (or a loop with 2n+1 number of vertices). Whenever sameMaskSpacing violations form an odd loop, it is not possible to color or pattern that design and so in turn the design cannot be manufactured. Therefore, the problem of manufacturability in dual masking systems can be reduced to a problem of detecting "odd loops" that are formed by shapes violating the sameMaskSpacing rule in the design layout. To fix this problem, the odd loop is broken by moving one of the shapes away from the others so that is more than a sameMaskSpacing distance away. In more complex situations involving more than 5 shapes, the solution of moving one of the shapes away is much more difficult.

In DPT, sameMaskSpacing violations are detected and highlighted (in a visualization scheme) based on odd loop violations. The specific shapes and associated sameMaskSpacing rules that contributed to the creation of the odd loop are detected and highlighted. The use of DPT adds to the complexity of the manufacturing as DPT is a process of splitting a layer into two separate masks (e.g., two colors or patterns including but not limited to red and green—associated with shapes in the design) to increase layout density. Additional information on DPT and detecting DPT odd loop violations is disclosed in U.S. patent application Ser. No. 13/794,221 filed on Mar. 11, 2013, and entitled "SYSTEM FOR DOUBLE PATTERNING TECHNOLOGY (DPT) ODD LOOP VISUALIZATION FOR AN INTEGRATED CIRCUIT LAYOUT" which is incorporated in its entirety by reference herein.

Integrated design layout technology is not only utilizing dual masking technology but also is utilizing triple masking technology. DPT cannot be used to detect triple pattern spacing violations which are quite different than odd loop violations and detection. Therefore, a method and system in accordance with the present invention provides a triple patterning technology (TPT) violation detection and visualization module that enables the detection, visualization, and fixing of the triple pattern spacing violations associated with triple masking technology.

The use of triple patterning technology (TPT) adds even further complexity because TPT is a multi-pattern process of splitting a layer into a plurality of separate masks (e.g., more than two colors or patterns including but not limited to red, green, blue, etc) to further increase density and avoid conflicts or odd loops. Therefore, the TPT violation detection and visualization module utilizes pattern recognition and detection as opposed to merely utilizing odd loop detection like in DPT violation detections.

It is important to note that any odd loop is a problem for DPT as an odd loop is not colorable thus results in an odd loop violation that must be fixed before the design can be manufactured. However, odd loops are not a problem for TPT since three colors can be utilized to overcome the coloring problem. Therefore, in certain design layouts, the addition of the third mask or color can overcome DPT related odd loop violations.

FIG. 1 illustrates a diagram 100 that compares DPT and TPT violation detection in an integrated circuit design layout in accordance with an embodiment. A first portion 102 of the diagram 100 displays a rule violation (e.g., sameMaskSpacing) using single mask conventional technology. A second portion 104 of the diagram 100 displays that you cannot use DPT to color or pattern the fifth shape with a question mark using one of the two already utilized colors or patterns. A third portion 106 of the diagram 100 displays that as a result of not being able to use one of the two already utilized colors or patterns, a DPT odd loop results that cannot be fixed using DPT. A fourth portion 108 of the diagram 100 displays that you can solve this DPT odd loop using TPT and the addition of a third color or pattern for the fifth shape that had the question mark.

Figure 2:
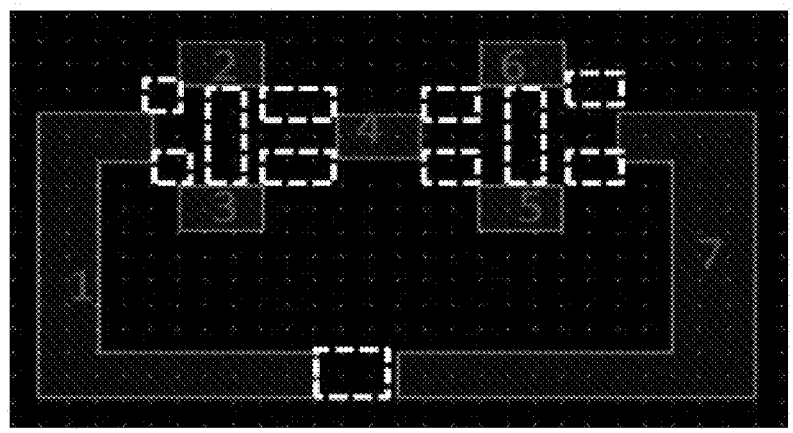
FIG. 2 illustrates a diagram of an integrated circuit design layout that cannot be colored using three colors in accordance with an embodiment.
Figure 2:
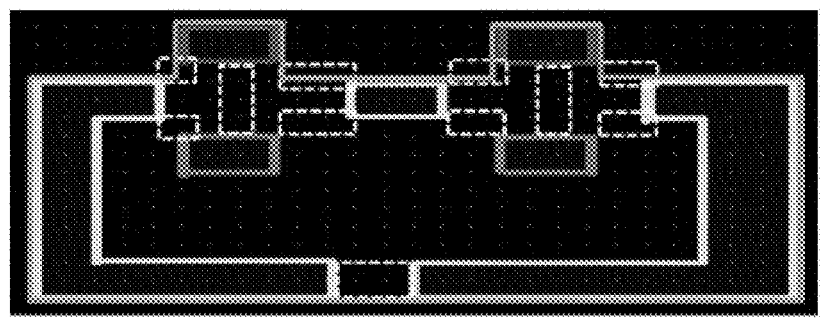
Figure 2:
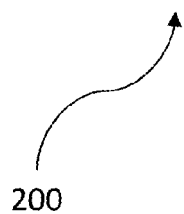

Furthermore, in many more complex designs (that are more complex than the design in FIG. 1), utilizing three separate colors or patterns for the various shapes does not mitigate against the presence of design rule violations including but not limited to DPT odd loops. FIG. 2 illustrates a diagram 200 of an integrated circuit design layout that cannot be colored using three colors in accordance with an embodiment. A top portion 202 of the diagram 200 displays a rule violation by the dotted lines between the shapes 1-7. A bottom portion 204 of the diagram 200 displays that the rule violation is not fixed by utilizing three separate colors or patterns because the bottom portion of shape 1 and shape 7 are in contact with each other using the same pattern (which does not fix the rule violation problem).

When the design layouts (such as those in FIG. 2) become more complex and involve shapes that span over multiple areas of the design, visualizing and fixing the underlying violations is difficult. The method and system in accordance with the present invention provides a TPT violation detection and visualization module that enables integrated circuit designers (DRC tool users) to understand which shapes are involved in the complex designs and how to visualize any underlying violations simplistically and efficiently to be able to fix them. The TPT violation detection and visualization module encapsulates design key information in an easy to understand form by detecting complex rule violations and converting the detected rule violations into visualizations (including but not limited to graph formats).

To describe the features of the present invention in more detail, refer now to the following description in conjunction with the accompanying Figures.

The TPT violation detection and visualization module maps the TPT violation problem into a graph coloring problem (i.e., creating a TPT color graph) and solves the graph coloring problem using a heuristic process that annotates the violations quickly in an innovative and comprehensive manner. In one embodiment, the TPT violation detection and visualization module provides a method for visualizing TPT violations of an integrated circuit design layout that comprises mapping sameMaskSpacing violations into a graph, partitioning the integrated circuit design layout into sub-graphs to represent disjoint clusters, reducing the graph so that unrelated edges for TPT are moved from the graph, detecting all possible TPT spacing violations for each sub-graph, adding or combining all of the violations detected for each sub-graph which results in a representation of all of the violations in a full graph, and visualizing the violations in the integrated circuit design layout.

Figure 3:
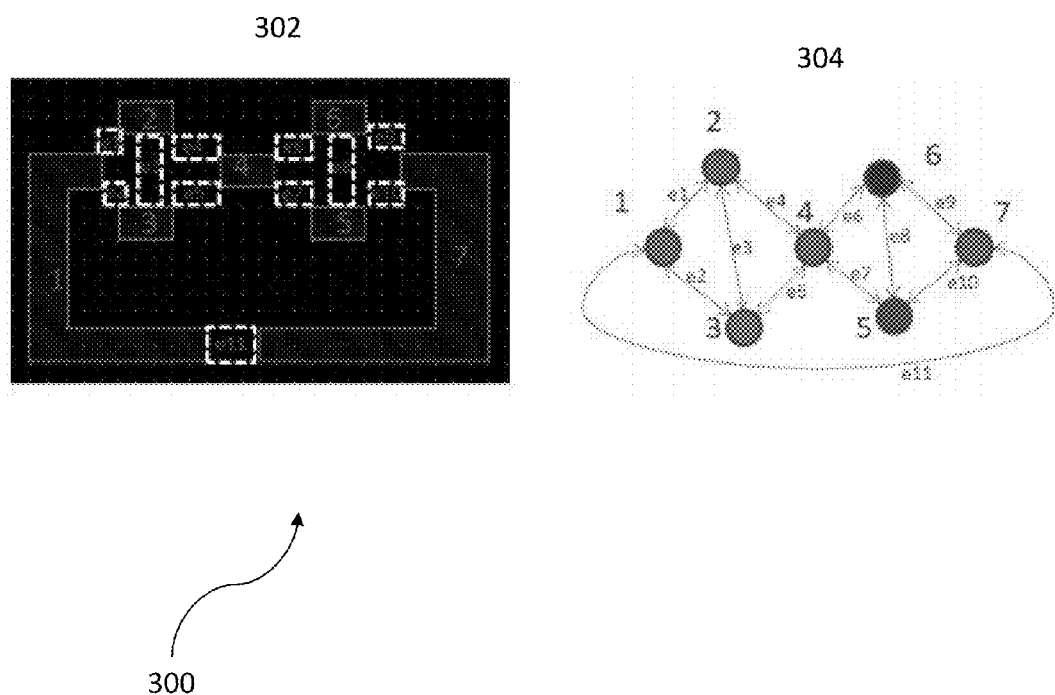
FIG. 3 illustrates a system for mapping the TPT violations into a color graph problem in accordance with an embodiment.

FIG. 3 illustrates a system 300 for mapping the TPT violations into a color graph problem in accordance with an embodiment. The system 300 is a TPT violation detection and visualization module. A first diagram 302 depicts an illustration of the integrated circuit design layout generated by the system 300. The integrated circuit design layout includes seven shapes (marked 1, 2, 3, 4, 5, 6, 7). The white dotted lines and areas denote sameMaskSpacing violations that are each an edge of a TPT color graph to be generated. A second diagram 304 depicts a graph (the TPT color graph) generated by the system 300. The graph includes the seven shapes (circles with corresponding markings 1-7) and eleven sameMaskSpacing violations (marked e1, e2, e3, e4, e5, e6, e7, e8, e9, e10, e11) that are each generated by the TPT violation detection and visualization module.

In one embodiment, the graph that is generated provides that every shape which is part of a sameMaskSpacing violation is a node (vertex) of the graph, every violation between the shapes is an edge of the graph, every node is assigned a color or pattern (in FIG. 3, only 3 colors/patterns are used), a TPT violation occurs when two neighboring nodes have the same color/pattern (i.e., can't be assigned on a different mask), and a TPT violation indicates the graph is not colorable or cannot be patterned using three colors or patterns. In another embodiment, the graph that is generated follows a different set of predetermined conditions.

Figure 4:
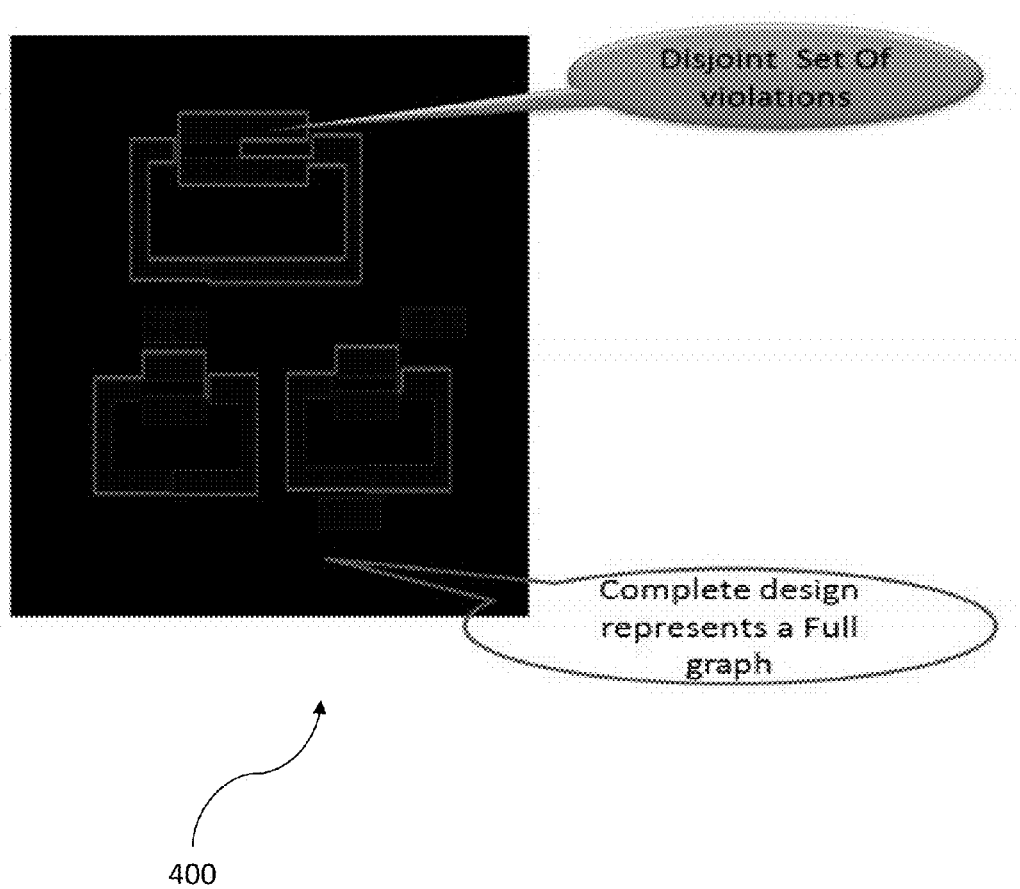
FIG. 4 illustrates a diagram of a disjoint set of violations in accordance with an embodiment.

As aforementioned, violations are added for each sub-graph into the full graph. In a given layout, all of the sameMaskSpacing violations are mapped to the full graph. However, in a layout design there can be several disjoint violation sets which represent a disjoint set of a graph or sub-graph. Therefore, the graph is partitioned into sub-graphs to reduce the problem size. FIG. 4 illustrates a diagram 400 of a disjoint set of violations in accordance with an embodiment. A full graph represents the mapping of all sameMaskSpacing violations into a single graph on a given layer in a given design. However, this might consist of several sub-graphs (clusters) which are disjoint to each other. The sameMaskSpacing violations on the layer may be a disjoint set of violations (disjoint clusters) and so the full graph may also consist of several disjoint sets of sub-graphs. In one embodiment, the full graph can get complex and so the full graph is partitioned into several sub-graphs by the TPT violation detection and visualization module. In this embodiment, the TPT violation detection and visualization module detects and visualizes the TPT violations on each individual sub-graph.

The TPT violation detection and visualization (TPTVDV) module treats TPT violations as a graph coloring problem by generating a graph (and possibly a plurality of sub-graphs) associated with each integrated circuit design layout. In a graph coloring problem, no two neighboring (connected) nodes can have the same color (or pattern). Therefore, the TPTVDV module determines whether the graph is colorable using three colors. If the graph is not colorable using three colors, then a TPT violation is detected.

Figure 5:
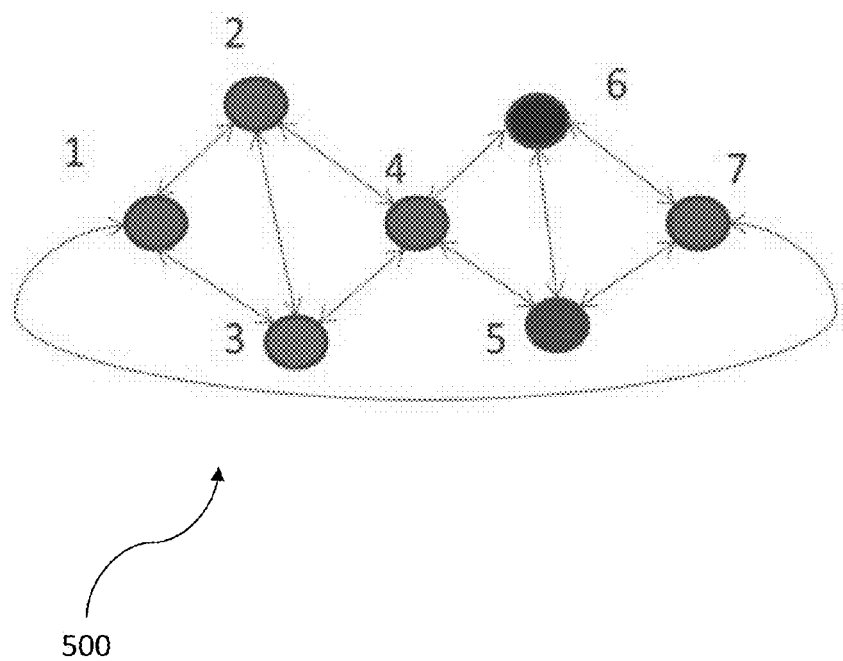
FIG. 5 illustrates a TPT color graph as generated by the TPT violation detection and visualization module in accordance with an embodiment.

Referring back to FIG. 3, the second diagram 304 depicts node 1 and node 7 as having the same color or pattern. Therefore, the layout represented by the graph (shown in diagram 304) generated by the TPT violation detection and visualization module has a TPT violation. FIG. 5 illustrates a TPT color graph 500 as generated by the TPT violation detection and visualization module in accordance with an embodiment. In FIG. 5, nodes 1 and 7 both have the same color/pattern and thus a TPT violation is detected by the TPT violation detection and visualization module.

As a result, after the TPT problem is mapped into a graph coloring problem by the TPT violation detection and visualization module, the graph or each plurality of sub-graphs generated from the graph is analyzed to determine whether the graph (or each sub-graph) is colorable using three colors. If not (three colors cannot be utilized between neighboring nodes end up having the same color) then a TPT violation is detected by the TPT violation detection and visualization module and automatically displayed (and highlighted) to the integrated circuit designer. In another embodiment, alerts are transmitted via a plurality of communication pathways (e.g., text, email, error message prompt, etc) to notify the integrated circuit designer of the TPT violation.

In one embodiment, the graph generated by the TPT violation detection and visualization module is further optimized by the TPTVDV module. To optimize the graph generated in accordance with the graph coloring problem, the redundancy is removed and the graph (or sub-graph being optimized) is deduced into a smaller graph.

Figure 6:
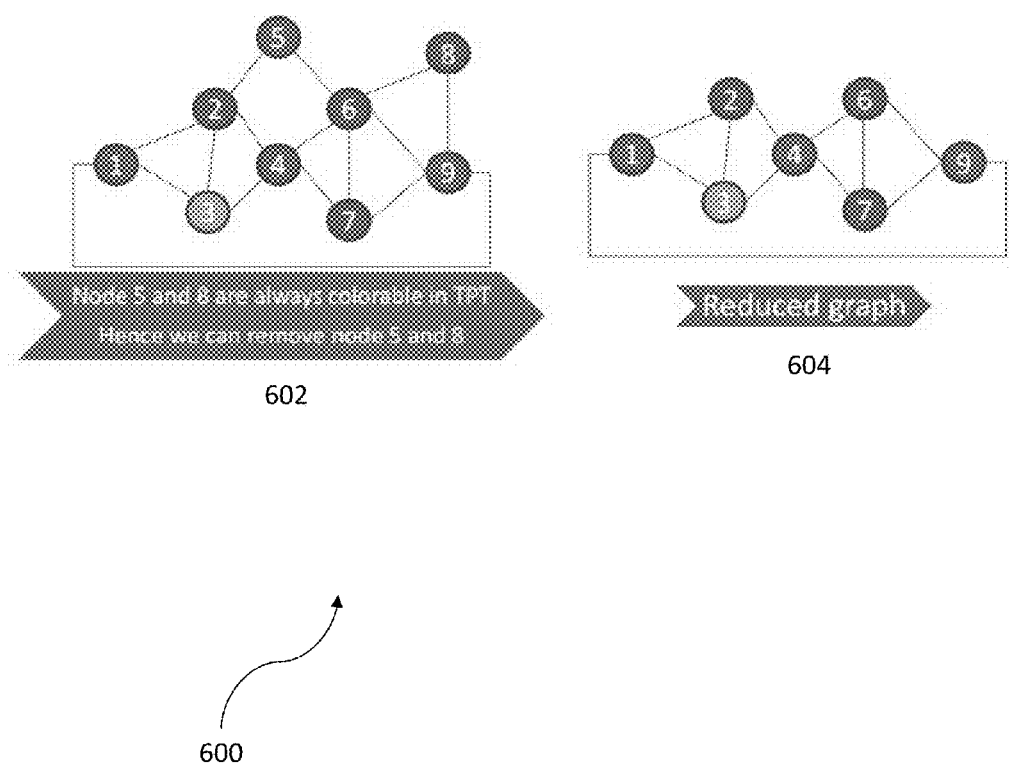
FIG. 6 illustrates a diagram of optimizing the TPT color graph by the TPT violation detection and visualization module in accordance with an embodiment.

FIG. 6 illustrates a diagram 600 of optimizing the TPT color graph by the TPT violation detection and visualization module in accordance with an embodiment. The diagram 600 includes a first TPT color graph 602 that depicts that nodes 5 and 8 are redundant because the two nodes are always colorable using one of the three colors regardless of what other colors are utilized. Therefore, a second TPT color graph 604 of the diagram 600 depicts the reduced graph optimized by the TPT violation detection and visualization module by eliminating nodes 5 and 8 after detecting that they were redundant.

In one embodiment, the TPT color graph is optimized by the TPT violation detection and visualization module by providing sub-graphs as connected graphs, determining whether the sub-graphs consist of redundant connections or nodes for TPT coloring, and removing the redundant nodes from the graph thereby reducing graph size and improving performance. A graph node with less than three connections is always colorable using three colors or patterns.

Figure 7:
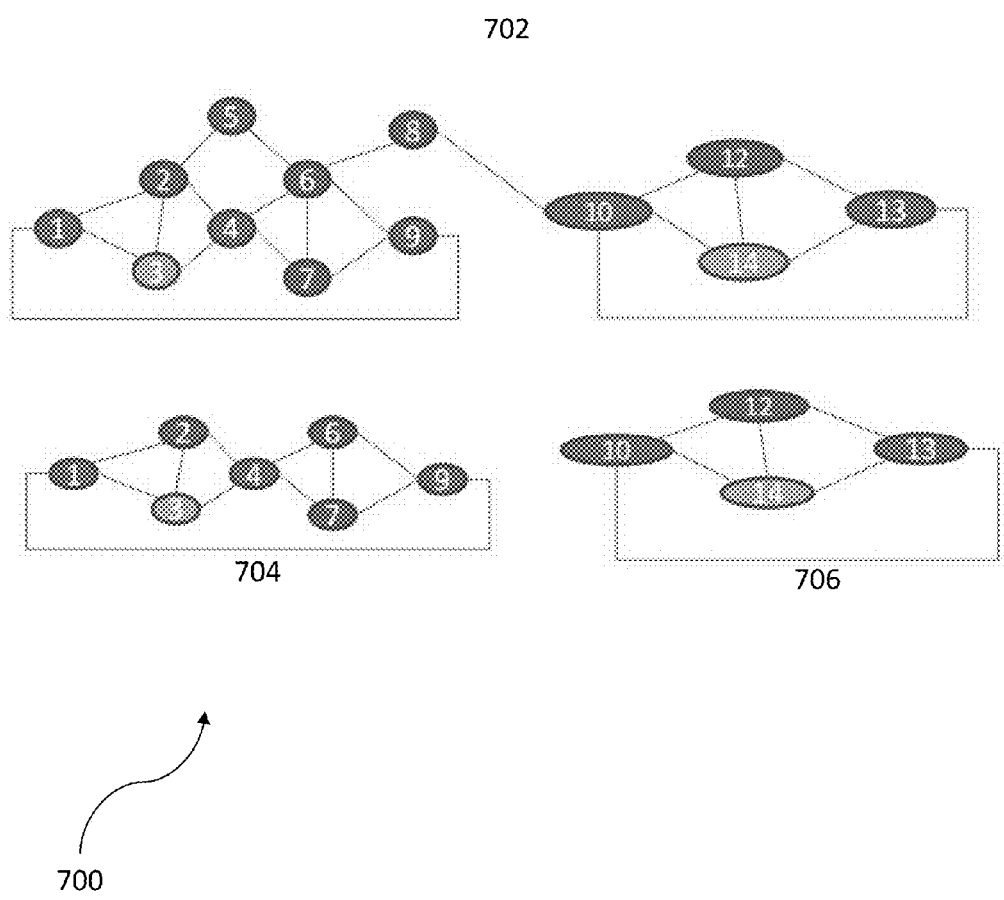
FIG. 7 illustrates a diagram of optimizing another TPT color graph by the TPT violation detection and visualization module in accordance with a second embodiment.

FIG. 7 illustrates a diagram 700 of optimizing another TPT color graph by the TPT violation detection and visualization module in accordance with an embodiment. The diagram 700 includes a top TPT color graph 702 that is optimized or partitioned into two separate TPT color graphs 704 and 706 respectively. In FIG. 7, and similar to FIG. 6, nodes 5 and 8 are redundant but the TPT color graph 702 is connected via nodes 8 and 10 to another graph portion (on the right side of the TPT color graph 702). The another graph portion is not reduced (as graph 706 and the another graph portion of graph 702 are the same) but the graph reduction results in the elimination of the connection between nodes 8 and 10.

The TPT violation detection and visualization module can be added to existing DRC tools to detect TPT violations. In one embodiment, the module adds a new constraint (e.g. tptColorConflict) for identifying TPT violations. The new constraint can be checked under a MPT color conflict option in existing DRC tools. In one embodiment, TPT violation detection is a mutually exclusive option for a given layer and is defaulted to off. The TPT violations can include sameMaskSpacing violations to form the TPT color graph. As aforementioned, if the graph is not colorable using three colors, an error market can be displayed by the TPTVDV module.

In one embodiment, the error marker provides information related to all of the shapes involved in the graph as well as the outer boundaries of all of the shapes involved. All of the shapes involved are assigned various colors and the TPT violations or conflicts are displayed by the TPTVDV module and to the integrated circuit designer to apply corresponding fixes. In another embodiment, based upon the detected and visualized TPT violations, the TPTVDV module presents the designer with a plurality of options (e.g., suggested places to move various conflicting shapes, nodes, etc) to select and apply to the design.

The TPT violation detection and visualization module colors or patterns the violating shapes for easy visualization by the designer/user. In one embodiment, all of the violating shapes are assigned a color or pattern and highlighted within the integrated circuit design layout. This helps to identify conflicting shapes clearly. The highlighting mechanism can be a plurality of mechanisms including but not limited to outlining the shapes with a dotted line, a bright yellow line, and highlighting the entire shape with a different or predetermined color.

Figure 8:
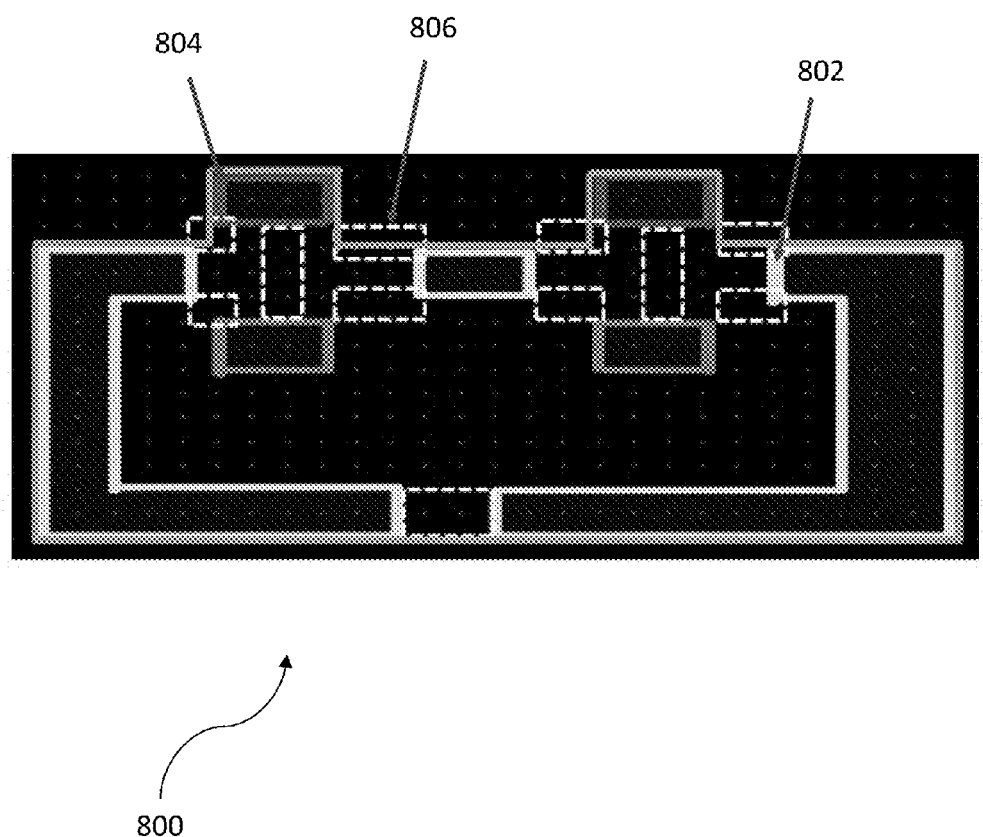
FIG. 8 illustrates a diagram of TPT violation marker visualization in accordance with an embodiment.

FIG. 8 illustrates a diagram 800 of TPT violation marker visualization in accordance with an embodiment. In the diagram 800, all of the violating shapes are assigned a separate color (red, green, yellow, orange, etc.) and are highlighted to help identify conflicting shapes quickly and efficiently. In one embodiment, the violating shapes are only highlighted when corresponding violation markers are selected by the user in the annotation browser. In another embodiment, the violating shapes are always highlighted. If the user specifically selects one of the violating shapes to focus on 804, a predetermined color (such as red) can be set aside for the highlighting and only utilized in those situations. For example, If the space marker option is also selected by the user in the annotation browser (or is set to default on always), then the space markers 806 (denoted by the dotted lines) will also be shown.

Figure 9:
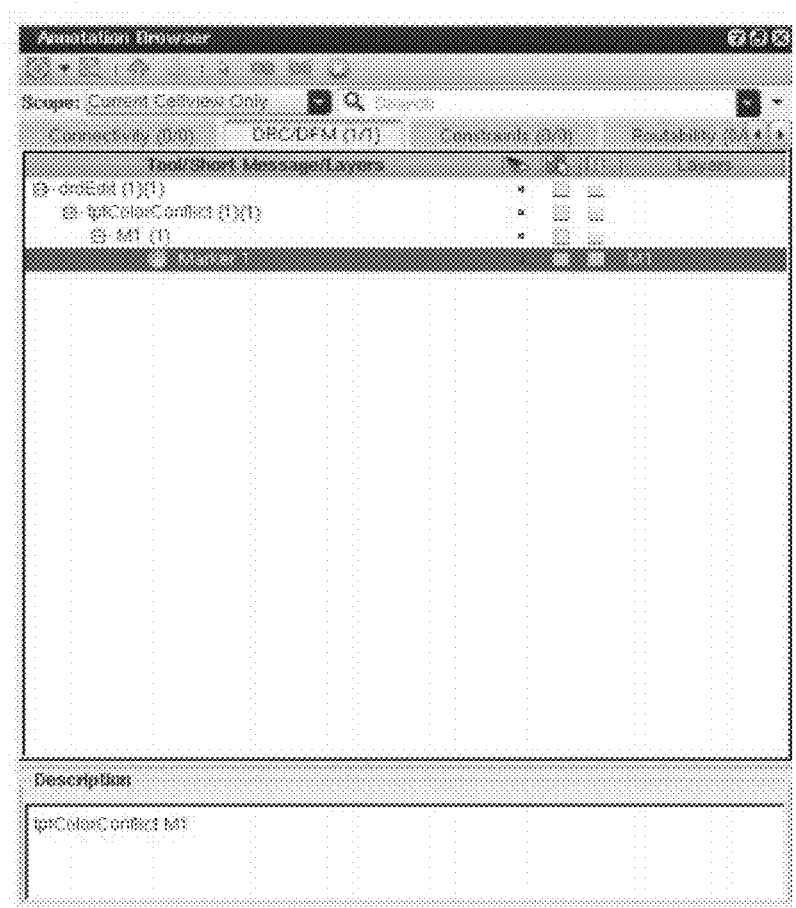
FIG. 9 illustrates an annotation browser of the TPT violation detection and visualization module in accordance with an embodiment.

In one embodiment, the violating shapes are only highlighted when specific violation markers are selected in an annotation browser of a DRC tool that integrates the TPT violation detection and visualization module. In another embodiment, all violating shapes are automatically highlighted. In addition to highlighting the violating shapes, spacer markers can also be shown once a certain violation marker is selected in the annotation browser. FIG. 9 illustrates an annotation browser 900 of the TPT violation detection and visualization module in accordance with an embodiment. The annotation browser 900 shows the selection of a violation marker (Marker 1) that is described as the tptColorConflict M1 marker. This enables the user to select other markers (such as markers related to DPT odd loop violations) within the same browser.

Figure 10:
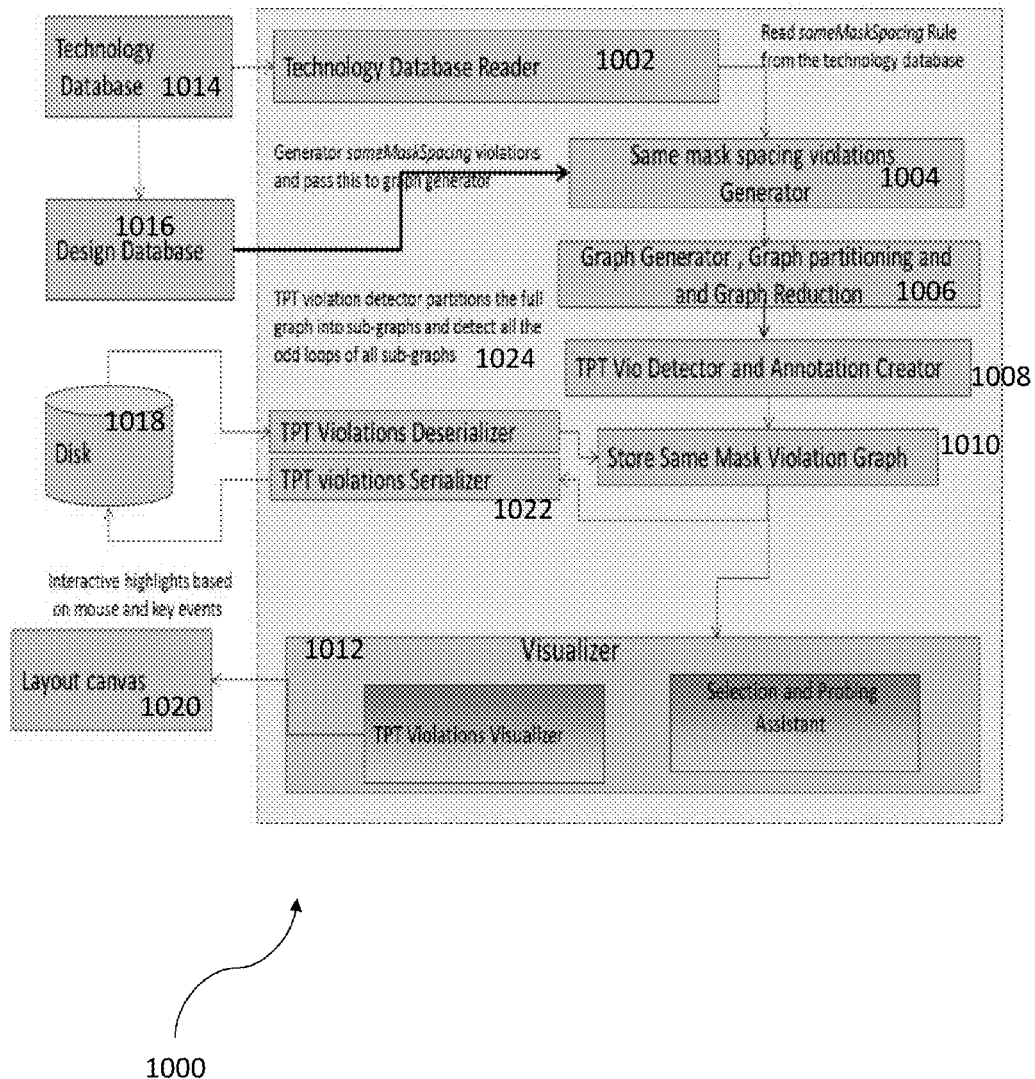
FIG. 10 illustrates a TPT violation detection and visualization module in accordance with an embodiment.

FIG. 10 illustrates a TPT violation detection and visualization module 1000 in accordance with an embodiment. The TPT violation detection and visualization (TPTVDV) module 1000 is a system for detecting and visualizing TPT violations in an integrated circuit design layout. The TPTVDV module includes a technology database reader unit 1002, a sameMaskSpacing violations generator unit 1004, a graph generating, partitioning, and reducing unit 1006, a TPT violation detector and annotation creation unit 1008, a storing unit 1010, and a TPT visualizer unit 1012.

The TPTVDV module 1000 communicates with an external technology database 1014 that is coupled to a design database 1016. In addition, the TPTVDV module 1000 communicates with an external disk 1018 and an external layout canvas 1020. In another embodiment, each of the technology database 1014, design database 1016, disk 1018, and layout canvas 1020 are integrated within and part of the TPTVDV module 1000.

In one embodiment, the technology database reader 1002 parses and reads the sameMaskSpacing rules that are stored and available in the technology database 1014. After reading the rules, the sameMaskSpacing violations generator 1004 (which is a checking utility) checks the design database 1016 and generates all the sameMaskSpacing violations in the integrated circuit design on each given layer based upon the sameMaskSpacing rules retrieved from the technology database 1014.

Once the violations are generated, they are transmitted to the graph generating, partitioning, and reducing unit 1006 which is responsible for generating the full graph on the basis of the sameMaskSpacing violations, provided by the sameMaskSpacing violations generator 1004. The generation of the graphs animates a graph in a sub window corresponding to the layout or animates sub-graphs corresponding to various clusters in the layout. The graphing unit 1006 also partitions the full graph into smaller sub-graphs based upon complexity detection or user inputs as shown by FIG. 4 and also reduces the sub-graphs (if desired) based upon the optimization mechanism as shown by FIG. 6. The sub-graphs can be disjoint to each other as disjoint clusters and include a disjoint set of violations. By separating the graphs into sub-graphs, complex violation detections can be simplified.

After the various graphing actions are applied by the graphing unit 1006, the TPT violations detector and annotation creation unit 1008 detects a variety of violations including but not limited to DPT related odd loop violations and TPT violations. The violations are detected within each of the sub-graphs (if the full graph was partitioned into sub-graphs) and also creates annotations for each of the violations with specific information (type of violation, location, shape, color, pattern, time detected, importance level, complexity, etc.). In one embodiment, the designer/user (and other parties with granted access) can comment on each of the violations as part of the annotations to create a chain of messages that can be shared. In another embodiment, near TPT violations are detected showing design features that are close to violating various rules but not yet violating them and recommendations are provided to avoid creating actual TPT violations when adding additional shapes or features to the design.

After the violations are detected and annotated, the violations are stored by the storing unit 1010. In one embodiment, the storing unit temporarily stores the graphs and associated violations into the disk 1018 (database). This information is used to visualize the sub-graphs into the layout canvas 1020 by the TPT visualizer unit 1012. The storing unit 1010 transmitted the information via a TPT violations serializer unit 1022 and to the disk 1018. The TPT violations serializer unit 1022 serializes the information and can also encrypt the information as well. When retrieving the information back from the disk 1018, the information is transmitted via a TPT violations deserializer 1024 and back to the storing unit 1010. The TPT violations deserializer unit 1024 deserializes the information and can also decrypt the information as well.

The TPT visualizer unit 1012 includes a TPT violations visualizer module for visualizing the detected TPT violations and a selection and probing assistant that enables various violations to be selected and probed for further information. In another embodiment, the visualizer unit 1012 also includes the capability of visualizing non-TPT violations including but not limited to DPT odd loop violations.

The layout canvas 1020 provides a visualizing stunning representations of the integrated circuit design layout and any associated and detected violations. The violations are automatically highlighted or are highlighted based upon user inputs (e.g., mouse and key events). The annotation browser (selection and probing assistant) can be utilized to highlight specific types of violations or sub-graphs with violations. In another embodiment, the visualizer unit 1012 includes a node collapsing/expansion feature that enables the user to hide and expand various nodes back to original form if a cluster (sub-graph) being analyzed is large or complicated. In addition, various zooming in and out capabilities can be included.

A TPT violation detection and visualization method and system in accordance with the present invention provides a process of detecting a plurality of design rule violations (DPT odd loops and TPT violations) in a given integrated circuit design layout and a mechanism to visualize the plurality of design rule violations in a virtuoso layout editor of a software program used in a computer system. The TPT violation detection and visualization module also provides a capability to visualization the violations in the form of graphs and sub-graphs and to probe and garner additional information about various design features of the layout and potential and detected violations. By detecting and visually highlighting the design violations, a designer/user of a DRC tool that includes the TPT violation detection and visualization module can more readily assess various design problems and apply fixes (that might also be recommended by the TPT violation detection and visualization module).

Figure 11:
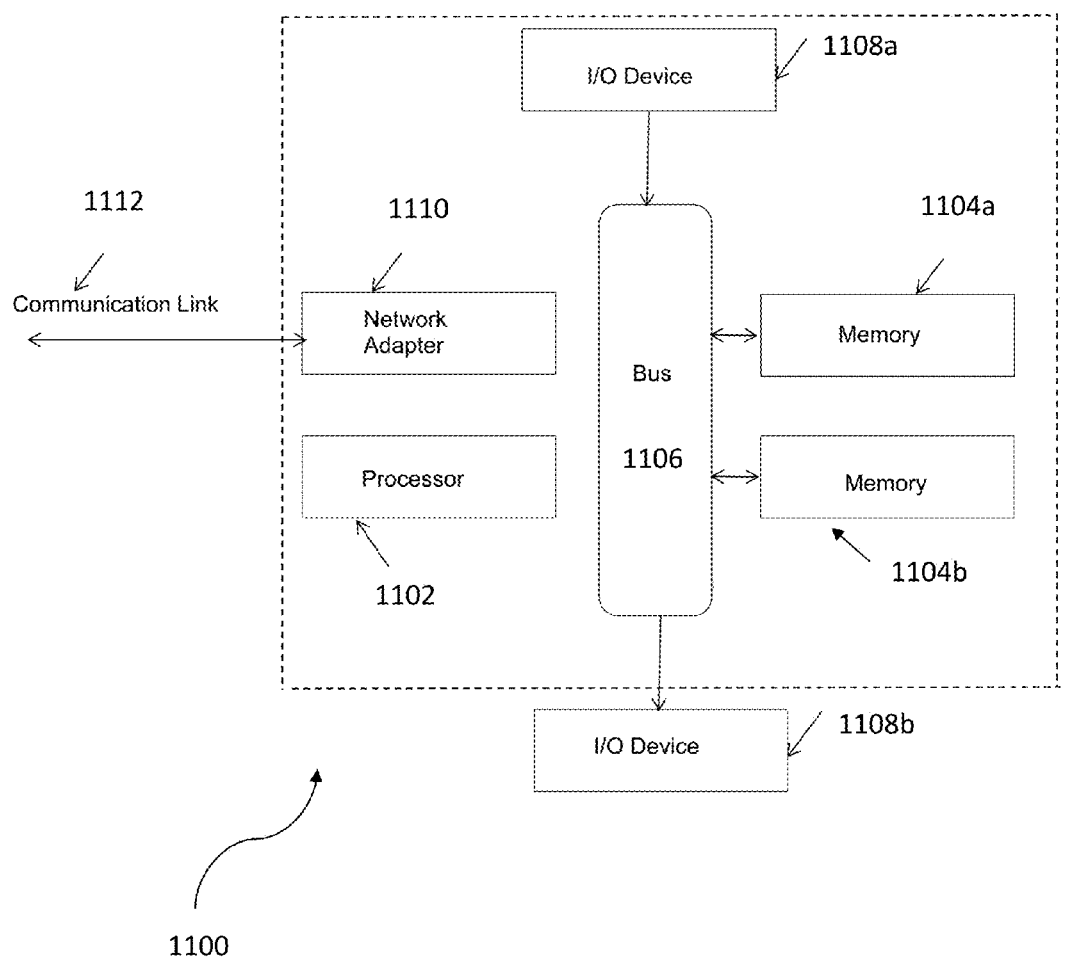
FIG. 11 illustrates a data processing system suitable for storing the computer program product and/or executing program code in accordance with an embodiment.

FIG. 11 illustrates a data processing system 1100 suitable for storing the computer program product and/or executing program code in accordance with an embodiment. The data processing system 1100 includes a processor 1102 coupled to memory elements 1104*a-b* through a system bus 1106. In other embodiments, the data processing system 1100 may include more than one processor and each processor may be coupled directly or indirectly to one or more memory elements through a system bus.

Memory elements 1104*a-b* can include local memory employed during actual execution of the program code, bulk storage, and cache memories that provide temporary storage of at least some program code in order to reduce the number of times the code must be retrieved from bulk storage during execution. As shown, input/output or I/O devices 1108*a-b* (including, but not limited to, keyboards, displays, pointing devices, etc.) are coupled to the data processing system 1100. I/O devices 1108*a-b* may be coupled to the data processing system 1100 directly or indirectly through intervening I/O controllers (not shown).

In FIG. 11, a network adapter 1111 is coupled to the data processing system 1100 to enable the data processing system 1100 to become coupled to other data processing systems or remote printers or storage devices or remote devices or remove mobile devices (e.g., smartphones) through a communication link 1112. Communication link 1112 can be a private or public network (e.g., Internet). Modems, cable modems, and Ethernet cards are just a few of the currently available types of network adapters.

In one embodiment, a method for triple patterning technology (TPT) violation detection and visualization within an integrated circuit design layout comprises mapping a plurality of violations of the integrated circuit design layout to a graph, generating a color graph corresponding to the graph, detecting at least one TPT violation from the color graph, and visualizing the at least one TPT violation on a layout canvas. In one embodiment, the layout canvas is a sub-window of a software program (e.g., DRC tool such as DRD) that is displayed on a display unit of a computing device (e.g., computer, laptop, server, smartphone).

In another embodiment, before generation of the color graph, the graph is partitioned into a plurality of sub-graphs, a color graph for each of the sub-graphs is generated, a plurality of TPT violations is detected from the plurality of color graphs, and the plurality of TPT violations (as well as the corresponding integrated circuit design layout portion including but not limited to a graph, sub-graph, or full graph) are visualized on the layout canvas.

In one embodiment, the method further comprises reducing the plurality of color graphs (that comprise a plurality of nodes) by detecting redundant nodes and then eliminating (or removing from the color graph) the redundant nodes to simplify the color graph. Unrelated edges of the plurality of color graphs are removed by the reducing step. In one embodiment, the TPT violations comprise sameMaskSpacing violations. In another embodiment, the TPT violations comprise a different type of violation denoted by a different marker notation than is used for sameMaskSpacing violations.

In one embodiment, the method further comprises adding up or combining all of the detected plurality of TPT violations into a full graph and visualizing all of the plurality of TPT violations of the full graph on the layout canvas. Each and every shape of the integrated circuit design layout that is part of a violation (e.g., violating shapes) is a node of one of the plurality of color graphs and each violation between each shape of the integrated circuit design layout is an edge of the graph or one of the plurality of sub-graphs. All of the violating shapes are highlighted with a specific color corresponding to a marker selection. In one embodiment, a separate color or pattern is used for each shape within each sub-graph or within the entire full graph. In another embodiment, similar colors are used to highlight various combinations of violations.

In one embodiment, the TPT violations that are detected is annotated using an annotation browser that is controlled by the designer/user of the DRC tool. In one embodiment, the visualizing step further comprises animating any of the graph and the color graph in a sub window of a display unit corresponding to the integrated circuit design layout. In one embodiment, not only are the violating shapes highlighted but spacer markers are also visualized (e.g., using dotted lines) on the layout canvas. In one embodiment, if the color graph is not colorable using three colors, then at least one TPT violation is detected.

In one embodiment, a system for triple patterning technology (TPT) violation detection and visualization within an integrated circuit design layout follows the aforementioned steps of the method. In one embodiment, a computer program product contains program instructions stored in a non-transitory computer readable storage medium for providing triple patterning technology (TPT) violation detection and visualization within an integrated circuit design layout, and the program instructions are executed by a computer that performs the aforementioned steps of the method.

In comparison, DPT violation detection is an odd loop detection problem of a graph whereas TPT violation detection is a graph color problem. In DPT, a set of nodes of a graph can create several cycles and every cycle is a different DPT odd loop problem. In TPT, cycles are not an issue. There are specific patterns that can cause problems and that is what is mapped by the TPT violation detection and visualization module to equivalent graph coloring problems.

In addition, while partitioning graphs into sub-graphs takes place in both DPT and TPT, graph reduction and optimization is not carried out in DPT. Table 1 further describes key differences.

TABLE 1

| DPT | TPT |
| --- | --- |
| DPT violation checking is an odd loop detection problem | TPT violation checking is a pattern problem, implemented using graph coloring heuristic |
| In DPT, odd loops are effectively all possible odd cycles in the graph, where the number of nodes >= 3 | Odd cycles are not a TPT problem |
| In DPT, a set of nodes of a graph can create several cycles and every cycle is a different DPT odd loop problem | This is not the case for TPT |
| DPT shows all possible cycles which gives clues as to how to break the odd loop with minimum changes in a given cluster | This is not the case for TPT. We find the smallest connected cluster with a single TPT violation. |
| In DPT, there is graph partition, but there is no graph reduction | In TPT, there is graph partition as well as graph reduction |
| The markers of DPT are different from TPT because the markers of DPT touch the inner edge of the shapes | The markers of TPT touch (enclose) the outer bound of the shapes |

As above described, a method and system in accordance with the present invention provides a TPT violation detection and visualization system (module) for detecting and visualizing TPT violations by generating a TPT color graph corresponding to a graph of an integrated circuit layout and by reducing the TPT color graph to eliminate redundancies. In addition, the TPT violation detection and visualization system can also detect other types of violations including but not limited to DPT odd loop violations.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer-implemented method for multi-patterning technology violation detection and visualization within an integrated circuit design layout, the computer-implemented method comprising:

mapping a plurality of violations of a design rule in the integrated circuit design layout into a plurality of edges in a graph;

generating, at one or more modules including a coloring module, a color graph corresponding to the graph at least by reducing a plurality of nodes in the graph into a plurality of colored nodes that reduces a graph size and by coloring the plurality of colored nodes in the color graph;

detecting at least one multi-patterning violation from the color graph using at least a pattern recognition or detection technique without utilizing odd loop detection techniques, wherein the at least one multi-patterning violation is detected when neighboring nodes of the plurality of colored nodes have a same color; and visualizing the at least one multi-patterning violation on a layout canvas to enable selection of a corresponding fix to the at least one multi-patterning violation.

2. The computer-implemented method of claim 1, further comprising:

partitioning the graph into a plurality of sub-graphs;
generating a plurality of color graphs each corresponding to one of the plurality of sub-graphs;
detecting a plurality of multi-patterning violations from the plurality of color graphs; and
visualizing the plurality of multi-patterning violations on the layout canvas.

3. The computer-implemented method of claim 2, further comprising:
reducing the plurality of color graphs by eliminating redundant nodes.

4. The computer-implemented method of claim 3, wherein unrelated edges of the plurality of color graphs are removed by the reducing.

5. The computer-implemented method of claim 1, wherein the at least one multi-patterning violation comprises at least one sameMaskSpacing violation.

6. The computer-implemented method of claim 2, further comprising:
combining all of the detected plurality of multi-patterning violations into a full graph; and
visualizing all of the plurality of multi-patterning violations of the full graph on the layout canvas.

7. The computer-implemented method of claim 2, wherein each shape of the integrated circuit design layout that is part of a violation is a node of one of the plurality of color graphs, further wherein each violation between each shape of the integrated circuit design layout is an edge of the graph or one of the plurality of sub-graphs.

8. The computer-implemented method of claim 1, wherein each shape of the integrated circuit design layout that is part of a violation is highlighted with a color corresponding to a marker selection.

9. The computer-implemented method of claim 1, wherein the detected at least one multi-patterning violation is annotated with violation information using an annotation browser, wherein the violation information includes any of violation type, location, shape, color, pattern, time detected, importance level, and comments.

10. The computer-implemented method of claim 1, wherein the visualizing step further comprises animating any of the graph and the color graph in a sub window of a display unit corresponding to the integrated circuit design layout.

11. The computer-implemented method of claim 1, further comprising:
visualizing at least one spacer maker on the layout canvas.

12. The computer-implemented method of claim 1, wherein if the color graph is not colorable using three colors, then the at least one multi-patterning violation is detected.

13. A system for multi-patterning technology violation detection and visualization within an integrated circuit design layout, the system comprising:
a graph generator module for mapping a plurality of violations of the integrated circuit design layout into a plurality of edges in a graph and to generate a color graph corresponding to the graph at least by reducing a plurality of nodes in the graph into a plurality of colored nodes that reduces a graph size and by coloring the plurality of colored nodes in the color graph;
a detector module for detecting at least one multi-patterning violation from the color graph using at least a pattern recognition or detection technique without utilizing odd loop detection techniques, wherein the at least one multi-patterning violation is detected when neighboring nodes of the plurality of colored nodes have a same color; and
a visualizer module for visualizing the at least one multi-patterning violation on a layout canvas to enable selection of a corresponding fix to the at least one multi-patterning violation.

14. The system of claim 13, wherein the graph generator module partitions the graph into a plurality of sub-graphs before generating a plurality of color graphs each corresponding to one of the plurality of sub-graphs, further wherein the detector module detects a plurality of multi-patterning violations from the plurality of color graphs, further wherein the visualizer module visualizes the plurality of multi-patterning violations on the layout canvas.

15. The system of claim 14, wherein graph generator module reduces the plurality of color graphs by eliminating redundant nodes, wherein unrelated edges of the plurality of color graphs are removed by the reduction.

16. The system of claim 13, wherein the at least one multi-patterning violation comprises at least one sameMaskSpacing violation.

17. A computer program product containing program instructions stored in a non-transitory computer readable storage medium for providing multi-patterning technology violation detection and visualization within an integrated circuit design layout, wherein the program instructions are executed by a computer that performs the following steps comprising:
mapping a plurality of violations of the integrated circuit design layout into a plurality of edges in a graph;
generating, at one or more modules including a coloring module, a color graph corresponding to the graph at least by reducing a plurality of nodes in the graph into a plurality of colored nodes that reduces a graph size and by coloring the plurality of colored nodes in the color graph;
detecting at least one multi-pattern violation from the color graph using at least a pattern recognition or detection technique without utilizing odd loop detection techniques, wherein the at least one multi-pattern violation is detected when neighboring nodes of the plurality of colored nodes have a same color; and
visualizing the at least one multi-pattern violation on a layout canvas to enable selection of a corresponding fix to the at least one multi-patterning violation.

18. The computer program product of claim 17, wherein the computer further performs the following steps comprising:
partitioning the graph into a plurality of sub-graphs;
generating a plurality of color graphs each corresponding to one of the plurality of sub-graphs;
detecting a plurality of multi-pattern violations from the plurality of color graphs; and
visualizing the plurality of multi-pattern violations on the layout canvas.

19. The computer program product of claim 18, wherein the computer further performs the following steps comprising:
reducing the plurality of color graphs by eliminating redundant nodes, wherein unrelated edges of the plurality of color graphs are removed by the reducing.

20. The computer program product of claim 17, wherein the at least one multi-pattern violation comprises at least one sameMaskSpacing violation.

* * * * *